(12) United States Patent
Walker

(10) Patent No.: US 8,171,211 B2
(45) Date of Patent: *May 1, 2012

(54) METHOD AND SYSTEM FOR MINIMIZING IMPACT OF REFRESH OPERATIONS ON VOLATILE MEMORY PERFORMANCE

(75) Inventor: Robert Michael Walker, Raleigh, NC (US)

(73) Assignee: QUALCOMM Incorporated, San Diegp, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/043,647

(22) Filed: Mar. 9, 2011

(65) Prior Publication Data

US 2011/0161579 A1 Jun. 30, 2011

Related U.S. Application Data

(63) Continuation of application No. 10/997,138, filed on Nov. 24, 2004, now Pat. No. 7,930,471.

(51) Int. Cl.
*G06F 12/06* (2006.01)

(52) U.S. Cl. ........ 711/106; 711/100; 711/105; 711/141; 711/167; 711/E12.078

(58) Field of Classification Search .................. 711/106, 711/100, 105, 141, 167, E12.078
See application file for complete search history.

(56) References Cited

U.S. PATENT DOCUMENTS

| | | | | |
|---|---|---|---|---|
| 4,965,722 A | * | 10/1990 | Tokuume | 711/106 |
| 4,984,209 A | | 1/1991 | Rajaram et al. | |
| 5,651,131 A | | 7/1997 | Chesley | |
| 5,873,114 A | | 2/1999 | Rahman et al. | |
| 5,907,857 A | | 5/1999 | Biswas | |
| 6,272,588 B1 | | 8/2001 | Johnston et al. | |
| 2002/0069319 A1 | * | 6/2002 | Lee et al. | 711/106 |
| 2006/0112217 A1 | | 5/2006 | Walker | |

FOREIGN PATENT DOCUMENTS

| | | |
|---|---|---|
| EP | 0338528 A2 | 10/1989 |
| JP | 1307997 | 12/1989 |
| JP | 04034792 | 5/1992 |
| JP | 06236683 | 8/1994 |
| JP | 10106259 | 4/1998 |
| JP | 2011018435 | 1/2011 |

OTHER PUBLICATIONS

International Preliminary Report on Patentability—PCT/US05/042535, The International Bureau of WIPO, Geneva Switzerland—May 30, 2007.
International Search Report—PCT/US05/042535, International Search Authority—European Patent Office—Apr. 12, 2006.
Written Opinion—PCT/US05/042535, International Search Authority—European Patent Office—Apr. 12, 2006.

* cited by examiner

*Primary Examiner* — Yong Choe
(74) *Attorney, Agent, or Firm* — Nicholas J. Pauley; Peter M. Kamarchik; Jonathan T. Velasco

(57) ABSTRACT

A memory system is provided. The system includes a volatile memory, a refresh counter configured to monitor a number of advanced refreshes performed in the volatile memory, and a controller configured to check the refresh counter to determine whether a regularly scheduled refresh can be skipped in response to detecting a request for the regularly scheduled refresh.

30 Claims, 2 Drawing Sheets

METHOD AND SYSTEM FOR MINIMIZING IMPACT OF REFRESH OPERATIONS ON VOLATILE MEMORY PERFORMANCE

CLAIM OF PRIORITY UNDER 35 U.S.C. 120

The present Application for Patent is a continuation of patent application Ser. No. 10/997,138 entitled "Method and System for Minimizing Impact of Refresh Operations on Volatile Memory Performance" filed Nov. 24, 2004, pending, and assigned to the assignee hereof and hereby expressly incorporated by reference herein.

BACKGROUND

1. Field

The present disclosure relates generally to memory devices, and more specifically, to methods and systems for minimizing impact of refresh operations on performance of volatile memories.

2. Background

Volatile memory is a storage medium that is generally structured as a number of arrays (or banks). Each bank is further arranged as a matrix of "memory cells" in rows and columns, with each column being further divided by the input/output (I/O) width of the memory. Locations within the memory are uniquely specified by bank, row and column. A memory controller may be used to retrieve data from the memory by indicating the data's bank, row and column location.

In the case of dynamic volatile memories, each cell must be refreshed, or re-energized, periodically in order to maintain data integrity. The cells have to be refreshed because they are designed around capacitors that store electrical charges, which may discharge over time. Refresh is the process of recharging, or re-energizing, the cells in memory. Cells are generally refreshed one row at a time. A number of methods currently exist that are designed to refresh volatile memories. Some, if not all, of these methods incur high cost in performance and/or power. For example, there are two common methods or techniques that are generally used to control the refresh of volatile memories in modern digital systems. One method relies on the memory to keep track of the row and bank that need to be refreshed using built-in refresh mechanisms that are available on the memory; the other method relies on the memory controller to keep track of the row and bank that need to be refreshed.

The first commonly used method is to use the auto-refresh and self-refresh functions of the volatile memories. These functions use the built-in refresh clock and refresh address of the memory. During active use of the memory, if a refresh cycle is required, the memory controller must precharge all the banks, and then use the auto-refresh command to tell the memory to issue an internal refresh cycle. In auto-refresh mode, the memory uses the refresh address in its internal refresh address counter to determine which row/bank to perform the refresh cycle and cycle through the relevant rows. When the memory enters the auto-refresh state, all banks have to be closed because the memory controller has no knowledge as to which bank is going to be refreshed by the memory.

During periods of non-use, the memory controller may place the memory in the self-refresh mode. In the self-refresh mode, the memory uses its own internal clock and refresh address counter to generate refreshes to refresh the row(s) of the memory. This method is good for saving power during idle states since the self-refresh mode can be used. The self-refresh state uses a small amount of power and maintains the contents of the memory by refreshing the memory. Due to the small amount of power needed, this method is commonly used in low power application.

According to the second method, control of the refresh is effected via the memory controller. This method does not use any of the built-in refresh mechanisms that are available on the memory. Under this method, at regularly given intervals (i.e., the refresh rate) the memory controller explicitly generates refreshes by opening and closing rows in a sequential manner using bank/row address combinations. The refresh clock, which determines the refresh rate, and the bank/row address combinations are internal to the memory controller. This method is best for high speed/high performance applications. This method allows the memory controller to refresh a particular memory bank while permitting other memory banks to remain open for access, resulting in higher performance; reads and writes to other banks can generally continue in parallel and uninterrupted. The downside to this method is that during system power down or long idle states, when the memory controller is not refreshing the memory, the memory cannot be kept in a self-refresh state. As mentioned above, the self-refresh state is a built-in function of most volatile memories. Since the self-refresh function of the memory increments a refresh address (i.e., the row/bank address) stored in a refresh address counter in the memory, independent of the memory controller, the refresh address maintained by the memory is not consistent or synchronized with the memory controller.

Refresh operations can reduce performance of memory subsystems because each refresh cycle forces a memory into an idle state, during which data access is not available. For example, if a refresh cycle is required for a particular memory bank while such bank is in an active state, the bank has to be shut down to allow the refresh operation to take place. Shutting down the bank means that whatever data operations that were to be performed have to be delayed, hence, affecting system performance.

Some existing schemes are available to reduce the performance impact of refresh operations. Such schemes typically involve using a higher than required refresh rate, so that more memory banks can be refreshed within a predetermined refresh period. By having more memory banks refreshed, the chances of having to shut down an active memory bank for refresh are reduced. Using a higher refresh rate, however, has its drawbacks. For example, an increase in refresh rate means more power is needed which, in turn, results in lower performance. Also, merely using a higher refresh rate does not always obviate the need to shut down an active memory bank when refresh is required; in some situations, an active memory bank has to be shut down regardless, thus, negating any benefits from using a higher refresh rate.

Hence, it would be desirable to provide more efficient methods and systems for minimizing impact of refresh operations on performance of volatile memories.

SUMMARY

In one aspect of the present invention, a memory system includes a volatile memory, a refresh counter configured to monitor a number of advanced refreshes performed in the volatile memory, and a controller configured to check the refresh counter to determine whether a regularly scheduled refresh can be skipped in response to detecting a request for the regularly scheduled refresh.

In another aspect of the present invention, a memory system includes a volatile memory, a refresh counter configured to maintain information relating to a number of advanced refreshes performed in the volatile memory, a controller configured to control the volatile memory, and a processor configured to manage interactions amongst the controller, the volatile memory and the refresh counter, the processor further configured to check the refresh counter to determine whether a regularly scheduled refresh can be skipped in response to detecting a request for the regularly scheduled refresh.

In yet another aspect of the present invention, a memory system includes a volatile memory, means for monitoring a number of advanced refreshes performed in the volatile memory, and means for checking the number of advanced refreshes performed to determine whether a regularly scheduled refresh can be skipped in response to detecting a request for the regularly scheduled refresh.

In one aspect of the present invention, a method for conducting refresh operations in a volatile memory includes monitoring a number of advanced refreshes performed in the volatile memory, and checking the number of advanced refreshes performed to determine whether a regularly scheduled refresh can be skipped in response to detecting a request for the regularly scheduled refresh.

It is understood that other embodiments of the present invention will become readily apparent to those skilled in the art from the following detailed description, wherein various embodiments of the invention are shown and described by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

Aspects of the present invention are illustrated by way of example, and not by way of limitation, in the accompanying drawings, wherein.

DETAILED DESCRIPTION

The detailed description set forth below in connection with the appended drawings is intended as a description of various embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention.

Figure 1:
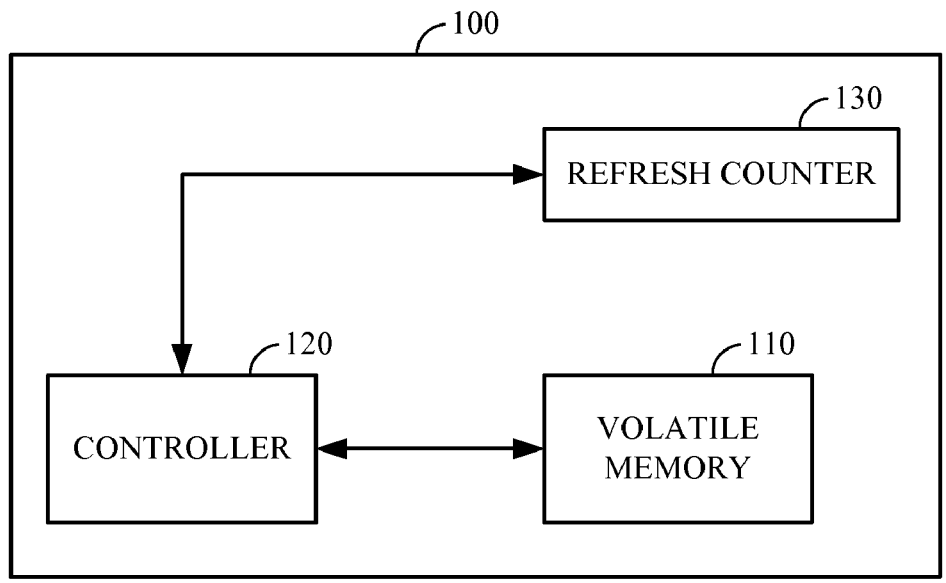
FIG. 1 is a simplified block diagram illustrating an arrangement that can be used to practice the refresh method according to the present disclosure.

The present disclosure in the form of one or more exemplary embodiments will now be described. In one aspect, a refresh method is provided which reduces impact on performance by refresh operations. FIG. 1 shows an arrangement 100 that can be used to practice the refresh method. As shown in FIG. 1, the refresh method may be practiced with a volatile memory 110, a controller 120 configured to control the volatile memory and a refresh counter 130. The volatile memory 110 can be, for example, a DRAM (dynamic random access memory), a SDRAM (synchronous DRAM), and various other types of DRAM, etc. Based on the disclosure and teachings provided herein, a person of ordinary skill in the art will appreciate how to practice the present disclosure with other types of memories which require refresh operations.

The refresh counter 130 is used to keep track of the number of advanced refreshes that have been performed, thereby allowing regularly scheduled refreshes to be skipped, as will be further described below. In one implementation, the refresh counter 130 is a three-bit (3-bit) counter, which means up to seven (7) advanced refreshes can be performed ahead of schedule. The size of the refresh counter 130 may vary depending on system and/or design constraints. Based on the disclosure and teachings provided herein, a person of ordinary skill in the art will appreciate how to implement the refresh counter according to the present disclosure.

In one aspect of the refresh method, before data transactions start to access the controller 120 to effectuate operations on the memory 110 (e.g., after the power-up sequence), the controller 120 directs the memory 110 to perform a number of refreshes until the refresh counter 130 reaches its maximum value. Each time a refresh is performed, the refresh counter 130 is incremented by one (1). These refreshes are advanced refreshes performed ahead of schedule. Regularly scheduled refreshes are initiated by an internal refresh clock or flag (not shown) associated with the memory 110. With a 3-bit counter, the maximum value for the refresh counter 130 is seven (7); hence, seven (7) advanced refreshes can be performed.

Figure 2:
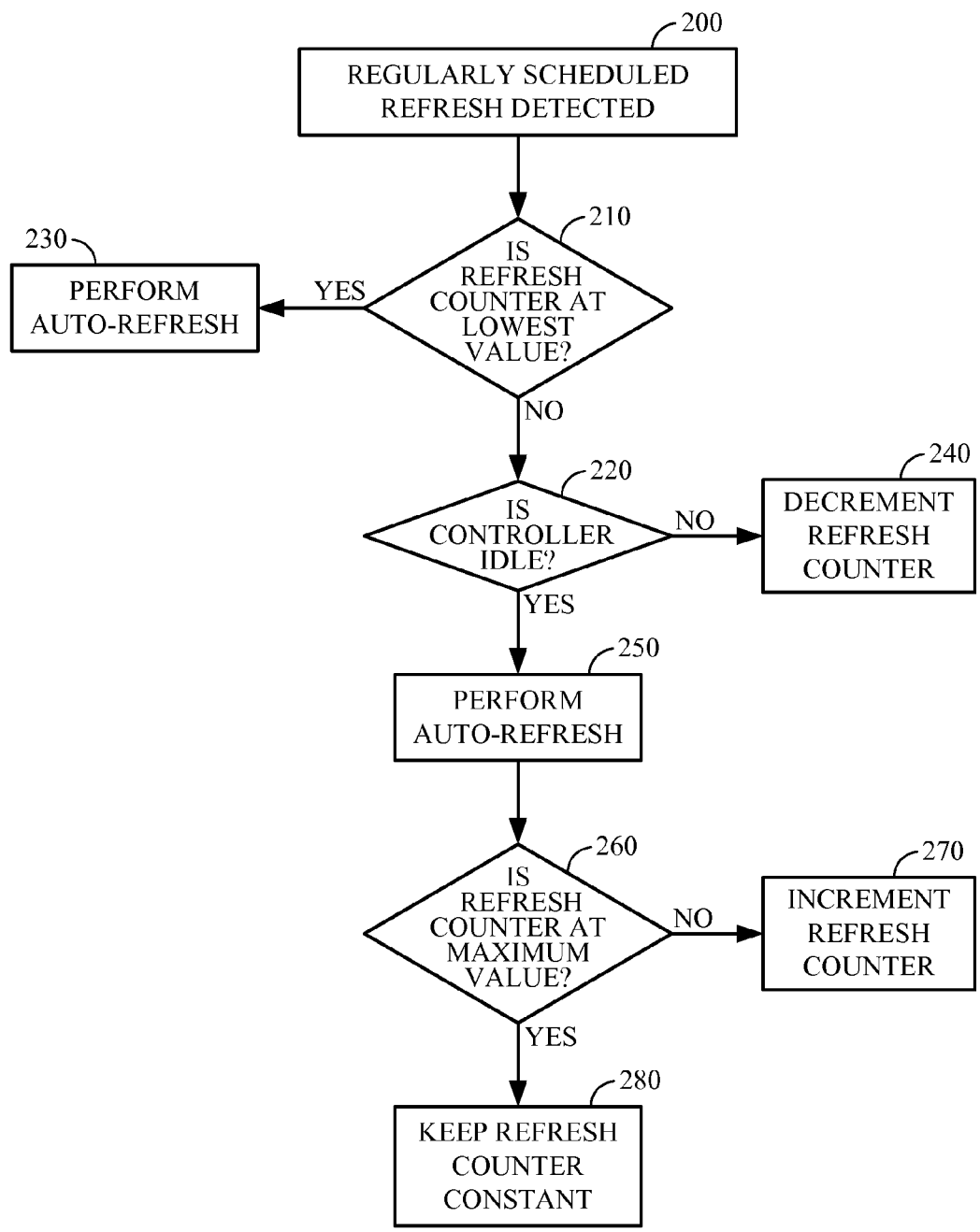
FIG. 2 is a flow chart illustrating the operational flow of the refresh method according to one aspect of the present disclosure.

FIG. 2 is a flow chart illustrating the operational flow of the refresh method according to one aspect of the present disclosure. In one implementation, the refresh method is effected via control logic or a processor which controls the controller 120, the memory 110 and the refresh counter 130. It should be understood that the control logic or processor may be implemented as an independent module or integrated as part of another component, such as, the controller 120. Based on the disclosure and teachings provided herein, a person of ordinary skill in the art will know other ways and/or methods to implement the present disclosure.

At block 200, a regularly scheduled refresh requested by the memory 110 is detected. Upon detecting the request for the regularly scheduled refresh, the refresh counter 130 is checked to determine its value. At block 210, if it is determined that the refresh counter 130 is at its lowest value (e.g., zero ("0")), then at block 230 one or more auto-refreshes are performed on the memory 110. These one or more auto-refreshes are advanced refreshes performed ahead of schedule. The number of auto-refreshes to be performed may vary depending on one or more conditions, such as, size of the refresh counter 130, design and/or performance criteria, etc. Based on the disclosure and teachings provided herein, a person of ordinary skill in the art will appreciate how to determine the number of auto-refreshes to be performed according to the present disclosure. The maximum number of auto-refreshes that can be performed equals to the size of the refresh counter 130. Each time an advanced auto-refresh is performed, the refresh counter 130 is incremented by one (1). Logically, when the value of the refresh counter 130 reaches its lowest value (e.g., zero ("0")), it means that all previously performed advanced refreshes have been used or, conversely, no more regularly scheduled refreshes can be skipped. Therefore, when the refresh counter 130 has reached its lowest value, auto-refresh(es) have to be performed on the memory 110 to prevent any data loss.

If it is determined that the refresh counter 130 is not at its lowest value (e.g., a non-zero value), then at block 220 the controller 120 is checked to determine whether it is idle (which means whether the memory 110 is also idle). If the controller 120 is not idle (i.e., conversely, the controller 120 is active), then at block 240 the refresh counter 130 is decremented by one (1) and the regularly scheduled refresh is not performed. Logically, decrementing the refresh counter 130 means using up an advanced refresh in exchange for not performing the regularly scheduled refresh.

If it is determined that the controller 120 is indeed idle, then at block 250 an auto-refresh is performed on the memory 110. After the auto-refresh is performed, the value of the refresh counter 130 is checked at block 260. If it is determined that the refresh counter 130 has not yet reached its maximum value, then at block 170 the refresh counter 130 is incremented. Incrementing the refresh counter 130 means that an additional advanced auto-refresh has been performed and thus a regularly scheduled refresh can be skipped at a later time.

If it is determined that the refresh counter 130 has reached its maximum value, then at block 280 the value of the refresh counter 130 remains unchanged.

Figure 3:
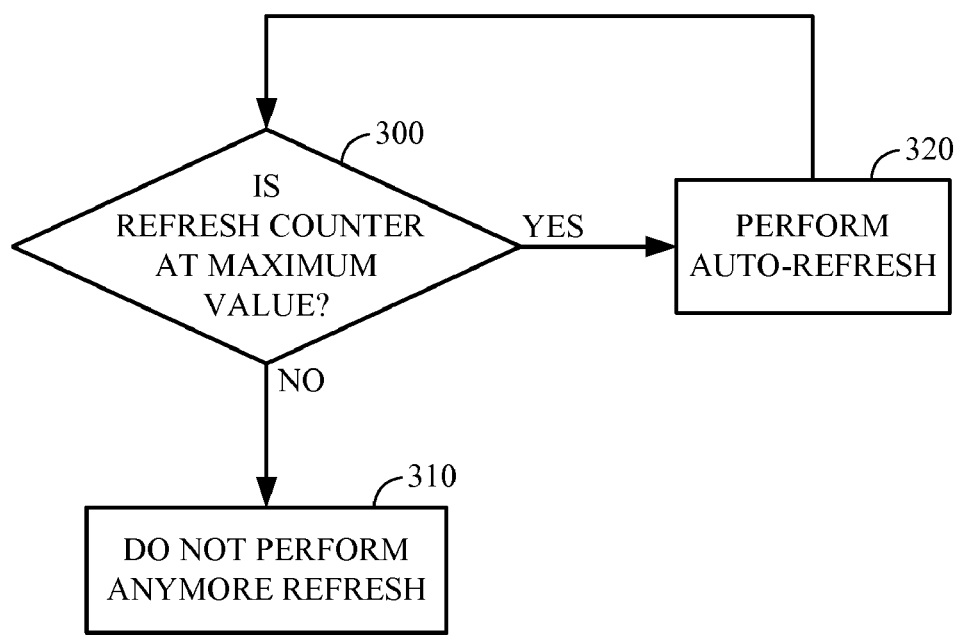
FIG. 3 is a flow chart illustrating the operational flow of the refresh method according to another aspect of the present disclosure.

FIG. 3 illustrates the operational flow of the refresh method according to another aspect of the present disclosure. The controller 120, whenever it is idle, continually directs the memory 110 to perform auto-refreshes until the refresh counter 130 has reached its maximum value, even when no regularly scheduled auto-refresh is detected. At block 300, when the controller 120 is idle and no regularly scheduled auto-refresh is detected, the value of the refresh counter 130 is checked to determine if it has reached its maximum value. If the refresh counter 130 has reached its maximum value, then no advanced refresh is performed at block 310. However, if the refresh counter 130 has not yet reached its maximum value, then at block 320 an auto-refresh is performed and the refresh counter 130 is incremented accordingly. Assuming that the controller 120 remains idle and no regularly scheduled refresh is detected, the process continues until the refresh counter 130 has reached its maximum value, i.e., the maximum number of allowable advanced refreshes have been performed, or some other predetermined value. The predetermined value may vary depending on one or more conditions, such as, size of the refresh counter 130, design and/or performance criteria etc. By performing the advanced refreshes, the controller 120 is able to keep ahead of regularly scheduled refreshes. By keeping ahead, the controller 120 can then skip one or more regularly scheduled refreshes later on when the controller 120 is busy handling commands from other parts of the system.

By using the refresh method as described above, a person of ordinary skill in the art will appreciate that the impact of refresh operations on memory performance is reduced. For example, by performing advanced refreshes and keeping ahead of regularly scheduled refreshes, the performance of the memory is optimized. Viewed another way, regularly scheduled refreshes are deferred in favor of previously performed advanced refreshes where appropriate, thus allowing memory resources to be utilized more efficiently. Furthermore, by deferring regularly scheduled refreshes, refresh intervals are extended which means less power is consumed which, in turn, leads to better performance.

The methods or algorithms described in connection with the embodiments disclosed herein may be embodied directly in hardware, in a software module executable by a processor, or in a combination of both, in the form of control logic, programming instructions, or other directions. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit of scope of the invention. Thus, the present invention is not intended to be limited to the embodiments shown herein, but is to be accorded the full scope consistent with the claims, wherein reference to an element in the singular is not intended to mean "one and only one" unless specifically so stated, but rather "one or more". All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for".

What is claimed is:

1. A memory controller coupled to a refresh counter, comprising:
    a refresh counter configured to monitor a number of auto-refreshes performed before a regularly scheduled refresh in a volatile memory; and
    a memory controller configured to:
        detect a the regularly scheduled refresh;
        determine that the refresh counter represents a number greater than zero;
        determine that the memory controller is idle in response to determining that the refresh counter represents the number greater than zero; and
        perform an auto-refresh in response to determining that the memory controller is idle.

2. The system of claim 1, wherein the memory controller is further configured to direct the volatile memory to perform the regularly scheduled refresh in response to the memory controller determining that the regularly scheduled refresh cannot be skipped.

3. The system of claim 2, wherein the memory controller is further configured to direct the volatile memory to perform the auto-refresh in addition to performing the regularly scheduled refresh.

4. The system of claim 3, wherein the number of auto-refreshes to be performed varies depending on at least one condition.

5. The system of claim 4, wherein the at least one condition is selected from a group of conditions that include the size of the refresh counter.

6. The system of claim 1, wherein a maximum number of auto-refreshes is performed and the maximum number is based on a number of rows in the volatile memory.

7. The system of claim 1, wherein the memory controller is further configured to direct the volatile memory not to perform the auto-refresh in response to determining that the memory controller is active and the refresh counter represents the number greater than zero.

8. The system of claim 7, wherein a value of the refresh counter is decremented in response to determining that the memory controller is active.

9. The system of claim 1, wherein the memory controller is further configured to determine whether the refresh counter has reached a maximum value.

10. The system of claim 9, wherein a value of the refresh counter is incremented in response to determining that the refresh counter has not reached the maximum value.

11. The system of claim 9, wherein a value of the refresh counter remains constant in response to determining that the refresh counter has reached the maximum value.

12. The system of claim 1, wherein the refresh counter includes a bit counter.

13. The system of claim 1, wherein the volatile memory includes one of a dynamic random access memory (DRAM) and a synchronous DRAM.

14. The system of claim 1, wherein the memory controller is further configured to update the refresh counter to reflect a reduced number of auto-refreshes performed in response to determining that the memory controller is active and the refresh counter is representing the number greater than zero.

15. A memory system comprising:
a refresh counter configured to maintain information relating to a number of auto-refreshes performed before a regularly scheduled refresh in a volatile memory;
a memory controller configured to control the volatile memory; and
a processor configured to manage interactions amongst the memory controller, the volatile memory and the refresh counter, the processor further configured to:
detect a the regularly scheduled refresh;
determine that the refresh counter represents a number greater than zero;
determine that the memory controller is idle in response to determining that the refresh counter represents the number greater than zero; and
perform an auto-refresh in response to determining that the memory controller is idle.

16. The system of claim 15, wherein the processor is further configured to modify execution of the regularly scheduled refresh in response to a determination that the regularly scheduled refresh cannot be skipped.

17. The system of claim 16, wherein the processor is further configured to control execution of the auto-refresh in addition to executing the regularly scheduled refresh.

18. The system of claim 17, wherein the number of auto-refreshes to be executed varies depending on at least one condition.

19. The system of claim 18, wherein the at least one condition is selected from a group of conditions that include the size of the refresh counter.

20. The system of claim 15, wherein the processor is further configured not to maintain execution of the auto-refresh in response to determining that the memory controller is active and the refresh counter is representing the number greater than zero.

21. The system of claim 20, wherein a value of the refresh counter is decremented in response to determining that the memory controller is active.

22. The system of claim 15, wherein the processor is further configured to determine whether the refresh counter is at a maximum value.

23. The system of claim 22, wherein a value of the refresh counter is incremented in response to determining that the refresh counter has not reached the maximum value.

24. The system of claim 22, wherein a value of the refresh counter remains constant in response to determining that the refresh counter has reached the maximum value.

25. The system of claim 15, wherein the refresh counter is a bit counter.

26. The system of claim 15, wherein the volatile memory includes one of a dynamic random access memory (DRAM) and a synchronous DRAM.

27. The system of claim 15, wherein the processor is further configured to update the refresh counter to reflect a reduced number of auto-refreshes performed in response to the processor determination that the memory controller is active and the refresh counter is representing the number greater than zero.

28. The system of claim 15, wherein the memory controller is configured to control the refresh counter, wherein the memory controller is further configured to direct the volatile memory to perform refresh operations.

29. A memory system coupled to a volatile memory operable to perform at least one auto-refresh prior to commencing data access, comprising:
means for detecting a regularly scheduled refresh;
means for determining that a refresh counter represents a number greater than zero;
means for determining that a memory controller is idle in response to determining that the refresh counter represents the number greater than zero; and
means for performing an auto-refresh in response to determining that the memory controller is idle.

30. A non-transitory computer-readable storage medium containing instructions stored thereon, which, when executed by a memory system coupled to a volatile memory operable to perform at least one auto-refresh prior to commencing data access, cause the memory system to perform actions, the instructions comprising:
program code to detect a regularly scheduled refresh;
program code to determine that a refresh counter represents a number greater than zero;
program code to determine that a memory controller is idle in response to determining that the refresh counter represents the number greater than zero; and
program code to performing an auto-refresh in response to determining that the memory controller is idle.

* * * * *